United States Patent
Schweger et al.

(10) Patent No.: US 7,330,202 B2
(45) Date of Patent: Feb. 12, 2008

(54) METHOD FOR CORRECTING SKEWED RECORDING WHEN EXPOSING PRINTING ORIGINALS

(75) Inventors: Thies Schweger, Husum (DE); Hans-Jürgen Ratjen, Bad Bramstedt (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 491 days.

(21) Appl. No.: 10/962,821

(22) Filed: Oct. 8, 2004

(65) Prior Publication Data
US 2005/0093960 A1    May 5, 2005

(30) Foreign Application Priority Data
Nov. 4, 2003    (DE) .................... 103 51 453

(51) Int. Cl.
*B41J 2/47* (2006.01)
*B41J 2/435* (2006.01)
(52) U.S. Cl. ............... 347/234; 347/264; 347/224
(58) Field of Classification Search ........... 347/224, 347/234, 264
See application file for complete search history.

(56) References Cited

U.S. PATENT DOCUMENTS

| | | | |
|---|---|---|---|
| 4,591,880 A | 5/1986 | Mitsuka | |
| 4,819,018 A * | 4/1989 | Moyroud et al. | 396/549 |
| 5,153,608 A * | 10/1992 | Genovese | 347/256 |
| 6,081,316 A | 6/2000 | Okamura et al. | |
| 2003/0106448 A1 | 6/2003 | Uemura | |
| 2003/0151657 A1* | 8/2003 | Moulin et al. | 347/262 |
| 2004/0169694 A1* | 9/2004 | Yamada | 347/19 |
| 2005/0104952 A1* | 5/2005 | Haushahn et al. | 347/224 |

FOREIGN PATENT DOCUMENTS

| | | |
|---|---|---|
| EP | 0 918 255 A2 | 5/1999 |
| EP | 1 318 660 A2 | 6/2003 |
| GB | 2 129 650 A | 5/1984 |

* cited by examiner

*Primary Examiner*—Stephen Meier
*Assistant Examiner*—Sarah Al-Hashimi
(74) *Attorney, Agent, or Firm*—Laurence A. Greenberg; Werner H. Stemer; Ralph E. Locher

(57) ABSTRACT

A method for correcting the skewed recording of a printing original on a recording material in an exposer includes the steps of projecting, with an exposure head, a linear array of exposure points generated by N laser beams onto the recording material and moving the exposure head continuously along an exposure drum in axial feeding direction as the exposure drum rotates. As a result, the printing original is recorded along a helix wound around the exposure drum. The laser beams are modulated with image data that is taken from a stored image point matrix along an angled read path, the read path running through the image point matrix at an angle formed by the helix with respect to a circumferential line of the exposure drum.

9 Claims, 3 Drawing Sheets

METHOD FOR CORRECTING SKEWED RECORDING WHEN EXPOSING PRINTING ORIGINALS

BACKGROUND OF THE INVENTION

1. Field of the Invention

The invention pertains to the field of electronic reproduction technology and relates to a method for correcting skewed recording of a printing original on a recording material, in particular, on a printing plate, in an exposer for recording printing originals.

In reproduction technology, printing originals for printed pages that contain all the elements to be printed such as texts, graphics and images are produced. For color printing, a separate printing original is produced for each printing ink and contains all the elements that are printed in the respective color. For four-color printing, these are the printing inks cyan, magenta, yellow, and black (CMYK). The printing originals separated in accordance with printing inks are also referred to as color separations. The printing originals are generally screened and, by using an exposer, are exposed onto films, with which printing plates for printing large editions are, then, produced. Alternatively, the printing originals can also be exposed directly onto printing plates in special exposure devices or they are transferred directly as digital data to a digital printing press. There, the printing-original data is, then, exposed onto printing plates, for example, with an exposing unit integrated into the printing press, before the printing of the edition begins immediately thereafter.

According to the current prior art, the printing originals are reproduced electronically. In such a case, the images are scanned in a color scanner and stored in the form of digital data. Texts are generated with text processing programs and graphics with drawing programs. Using a layout program, the image, text, and graphic elements are assembled to form a printed page. Following the separation into the printing inks, the printing originals are, then, present in digital form. The data formats largely used nowadays to describe the printing originals are the page description languages PostScript and PDF (portable document format). In a first step, the PostScript or PDF data is converted in a raster image processor (RIP) into color separation values for the CMYK color separations before the recording of the printing originals. In the process, for each image point, four color separation values are produced as tonal values in the value range from 0 to 100%. The color separation values are a measure of the color densities with which the four printing inks cyan, magenta, yellow, and black have to be printed on the printing material. In special cases, in which printing is carried out with more than four colors (decorative colors), each image point is described by as many color separation values as there are printing inks. The color separation values can be stored, for example, as a data value with 8 bits for each image point and printing ink, with which the value range from 0% to 100% is subdivided into 256 tonal value steps.

The data from a plurality of printed pages is assembled together with the data of further elements, such as register crosses, cut marks, and folding marks and print control fields, to form printing originals for a printed sheet. This printed sheet data is, likewise, provided as color separation values (CMYK).

Different tonal values of a color separation to be reproduced may be reproduced in the print only by surface modulation of the printing inks applied, that is to say, by screening. The surface modulation of the printing inks can be carried out, for example, in accordance with a dot screening method, in which the various tonal value steps of the color separation data are converted into halftone dots of different size, which are disposed in a regular pattern with periodically repeating halftone cells. During the recording of the color separations on a printing plate, the halftone dots in the individual halftone cells are assembled from exposure points that are an order of magnitude smaller than the halftone dots. A typical resolution of the exposure points is, for example, 1000 exposure points per centimeter, that is to say, an exposure point has the dimensions 10 µm×10 µm. Conversion of the color separation values into halftone dots takes place in a second step during the further processing of the color separation data in the raster image processor. As a result, the color separation data is converted into high-resolution binary values with only two lightness values (exposed or not exposed) that form the pattern of the modulated dot grid. As such, the printing original data of each color separation is described in the form of a high-resolution halftone bitmap that, for each of the exposure points on the printed area, contains a bit that indicates whether this exposure point is to be exposed or not.

In the recording devices that are used in electronic reproduction technology for the exposure of printing originals and printing forms, for example, a laser beam is generated by a laser diode, shaped by optical measures and focused on to the recording material and deflected over the recording material point-by-point and line-by-line by a deflection system. There are also recording devices that, to increase the exposure speed, produce a bundle of laser beams, for example, with a separate laser diode for each laser beam, and expose a plurality of recording lines of the printing form simultaneously each time they sweep across the recording material. The printing forms can be exposed onto the film material so that what are referred to as color separation films are produced, which are, then, used for the production of printing plates by a photographic copying process. Instead, the printing plates, themselves, can also be exposed in a plate exposer or directly in a digital press, into which a unit for exposing plates is integrated. The recording material can be located on a drum (external drum exposer), in a cylindrical hollow (internal drum exposer), or on a flat surface (flatbed exposer).

Flatbed exposers operate for the most part with a rapidly rotating polygonal mirror, whose mirror surfaces deflect the laser beam transversely over the recording material, while, at the same time, the recording material is moved at right angles to the deflection direction of the laser beam. As such, exposure is carried out recording line by recording line. Because, during the movement of the laser beam over the recording material, the length of the light path changes, complicated imaging optics that compensate for the change in size of the exposure point caused by this are needed.

In the case of an internal drum exposer, the material to be exposed is mounted on the inner surface of a partly open hollow cylinder and exposed with a laser beam that is aimed along the cylinder axis onto a deflection device that reflects the laser beam perpendicularly onto the material. The deflection device, a prism, or a mirror, rotates at high speed during operation and, and the same time, is moved in the direction of the cylinder axis so that the deflected laser beam describes circular or helical recording lines on the material.

In the case of an external drum exposer, the material to be exposed, in the form of films or printing plates, is mounted on a rotatably mounted drum. As the drum rotates, an exposure head is moved axially along the drum at a relatively short distance. The exposure head focuses one or more laser beams onto the drum surface, sweeping over the drum surface in the form of a narrow helix. As such, during each drum revolution, one or more recording lines are exposed onto the recording material.

To shorten the exposure time and, therefore, to increase the economy of the exposer, external drum exposers are, preferably, operated with a bundle of N laser beams that, by exposure optics, image a linear array of exposure points on the surface of the recording material, oriented in the axial direction of the exposure drum. The number of laser beams is, for example, N=64, but can also be a multiple thereof. If the exposure drum rotates, N recording lines are, then, exposed in parallel, winding helically around the surface of the exposure drum. The feed speed of the exposure head is set such that, after one drum revolution, it has moved in the axial direction of the drum by a distance that corresponds to the width of the N recording lines. As a result, the N recording lines to be exposed during the next drum revolution immediately follow the N recording lines exposed during the preceding drum revolution. In another operating mode, what is referred to as the interleave writing method, the laser beams are not imaged as N exposure points with a spacing of one recording line width in each case but with a greater spacing that corresponds to the width of a plurality of recording lines. The feed speed of the exposure head is, then, set such that, during successive drum revolutions, the gaps between the recording lines initially exposed are gradually filled with further recording lines. In every case, however, the feed distance per drum revolution is so high that the recording lines are recorded in a noticeably skewed manner in accordance with the helix. As a result, the printing original data in the form of a rectangular raster bit map is distorted to form a parallelogram.

Various methods are known with which the skewed recording of the printing original data in an external drum exposer is compensated. In U.S. Pat. No. 4,591,880 to Mitsuka, a method is described in which the starting point of the recording lines is advanced somewhat from revolution to revolution so that a rectangular matrix of image points is recorded but, overall, in relation to the edges of the recording material, is rotated by the angle of the skewed recording.

In the method disclosed in European Patent Application 1318660 A2, U.S. Patent Publication No. 2003/0106448 to Uemura, in addition to offsetting the starting point of the recording lines from revolution to revolution, the recording material is clamped onto the exposure drum in a skewed manner, to compensate for the angle of the skewed recording so that the image point matrix is exposed rectangularly and parallel to the edges of the recording material.

According to the method described in British Patent No. GB 2129650 A, the correction to the skewed recording is carried out by moving the exposure head on the exposure drum along a line that is inclined with respect to the drum axis by the angle of the skewed recording.

In European Patent Application 0918255 A2, corresponding to U.S. Pat. No. 6,081,316 to Okamura et al., a method is described with which the printing original data is pre-distorted to compensate for the skewed recording. For this purpose, the printing original data is shifted in a buffer memory in the opposite direction to the angle of the skewed recording so that the image point matrix is deformed into a parallelogram inclined in the opposite direction. As a result of the subsequent skewed recording, this pre-distortion is canceled again, and the image point matrix is recorded rectangularly.

SUMMARY OF THE INVENTION

It is accordingly an object of the invention to provide a method for correcting skewed recording when exposing printing originals that overcomes the hereinafore-mentioned disadvantages of the heretofore-known devices and methods of this general type and that provides an alternative and simple method for correcting the skewed recording in an external drum exposer that exposes a printing original with N laser beams, in each case N recording lines being exposed simultaneously with each drum revolution. The correction is made in that, during the recording, the printing original data is read out of a memory for the image point matrix along a path that is inclined in the direction of the skewed recording by the angle of the skewed recording. As such, the image point matrix is recorded in an undistorted manner without the image point matrix having to be pre-distorted or image data having to be shifted in the memory.

With the foregoing and other objects in view, there is provided, in accordance with the invention, a method for correcting a skewed recording of a printing original on a recording material in an exposer, including the steps of clamping the recording material onto an exposure drum, generating, with an exposure head, N laser beams projected onto the recording material as a linear array of exposure points oriented in a feed direction, continuously moving the exposure head along the exposure drum in an axial feed direction as the exposure drum rotates and recording the printing original along a helix wound around the exposure drum, modulating the laser beams with image data taken from a stored image point matrix organized in image lines, recording the printing original with an exposure resolution of A image points per unit length, forming recording lines from image data taken from the image point matrix along an angled read path, and modulating the laser beams with the image data of the recording lines.

In accordance with another feature of the invention, the recording lines forming step is carried out by forming recording lines from image data taken from the image point matrix along a read path running through the image point matrix at an angle formed by the helix with respect to a circumferential line of the exposure drum.

In accordance with a further feature of the invention, the recording lines are assembled from line sections taken from adjacent image lines.

In accordance with an added feature of the invention, a number of image points K per line section are determined in accordance with the equation:

$$K=(U \times A)/N,$$

where U is the circumference of the exposure drum.

In accordance with an additional feature of the invention, a change point Ti, at which a next line section in a next image line begins is determined in accordance with the equation:

$$Ti=[i \times K]_1 \ (i=0, 1, 2, \ldots),$$

where the product in brackets is rounded to the next integer.

In accordance with yet another feature of the invention, a change point Ti, at which a next line section in a next image line begins is determined in accordance with the equation:

$$Ti=[i \times K]_{WL} \ (i=0, 1, 2, \ldots),$$

where the product in brackets is rounded to the next integer that can be divided by WL and WL is a word length in bits of a memory in which the image point matrix is stored.

In accordance with yet a further feature of the invention, a calculated change point Tb for a start of an $i^{th}$ line section in a next image line is determined in accordance with the equation:

$$Tb=[i \times K]_1 \ (i=0, 1, 2, \ldots),$$

where the product in brackets is rounded to the next integer, in a testing region around the calculated change point Tb, a check is made to determine if at least one color jump occurs in image data in a current image line and/or the next image line, and the current change point Ti at which a next line section in the next image line begins is fixed at a point at which a color jump occurs in the image data.

In accordance with yet an added feature of the invention, the current change point Ti is fixed at the color jump lying closest to the calculated change point Tb.

In accordance with yet an additional feature of the invention, N recording lines are exposed with a spacing 1/A in parallel on the recording material.

In accordance with a concomitant feature of the invention, N recording lines are exposed with a spacing that is a multiple of 1/A in parallel on the recording material.

Other features that are considered as characteristic for the invention are set forth in the appended claims.

Although the invention is illustrated and described herein as embodied in a method for correcting skewed recording when exposing printing originals, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
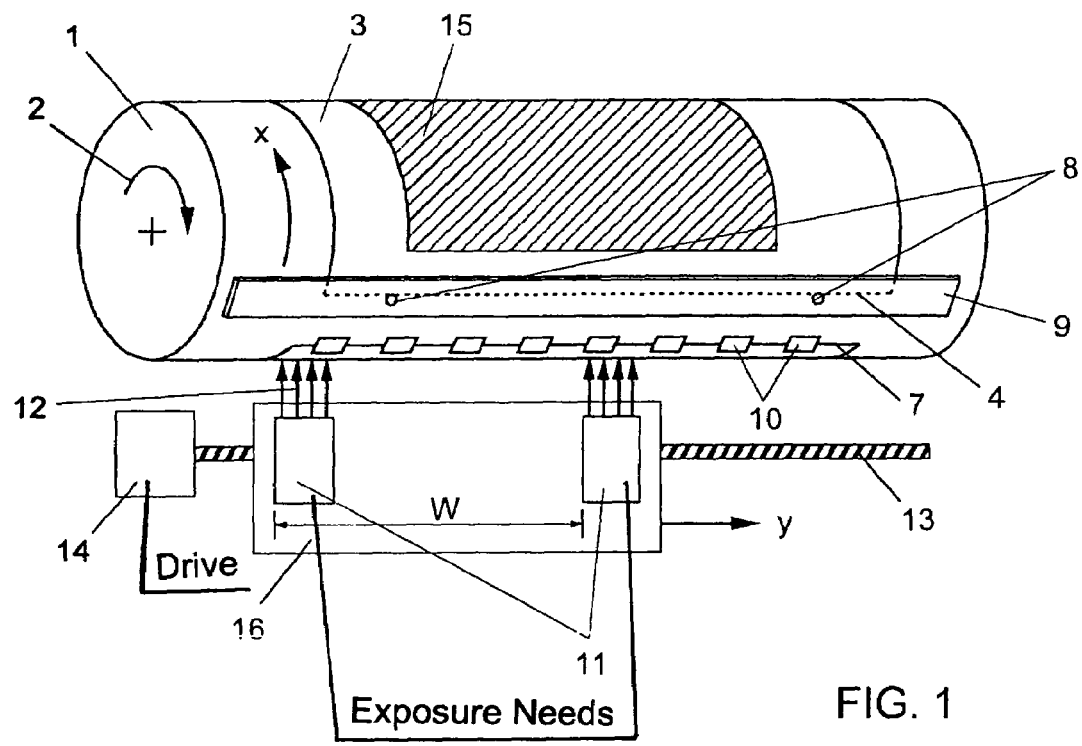
FIG. 1 is a diagrammatic perspective view of a structure of an external drum exposer according to the invention.

Referring now to the figures of the drawings in detail and first, particularly to FIG. 1 thereof, there is shown, in schematic form, a structure of an external drum exposer for exposing a printing original 15 onto a printing plate 3. An exposer drum 1 is rotatably mounted and can be set into a uniform rotational movement in the direction of the rotational arrow 2 by a non-illustrated rotational drive. An unexposed printing plate 3 is clamped onto the exposure drum 1. The printing plate 3 is clamped on such that its leading edge 4 touches contact pins 8, which are firmly connected to the exposure drum 1 and project beyond the surface of the exposure drum 1. A clamping strip 9 additionally presses the leading edge 4 firmly onto the surface of the exposure drum 1 and, as a result, fixes the leading edge 4 of the printing plate 3. The printing plate 3 is held flat on the drum surface by a vacuum device that is not illustrated in FIG. 1. The vacuum device attracts the printing plate 3 by suction through holes in the drum surface so that the printing plate 3 is not detached by the centrifugal forces during the rotation of the exposure drum 1. In addition, the trailing edge 7 of the printing plate 3 is prevented from lifting off the exposure drum 1 by pieces 10.

An exposure head 11 or else a plurality of exposure heads 11 that are disposed on a common exposure head carrier 16 are moved axially along the exposure drum 1 at a relatively short distance as the exposure drum 1 rotates. Each exposure head 11 focuses a bundle of N laser beams 12 onto the drum surface, which sweep over the drum surface in the form of helices. As such, during each drum revolution, one or a plurality of groups of N recording lines is exposed on the recording material in the circumferential direction x. The exposure head carrier 16 is moved in the feed direction y by a feed spindle 13, to which it is connected by a form fit and which is set moving rotationally by a feed drive 14.

As a result of using a plurality of exposure heads 11, the productivity of the exposer is increased, in particular, for the exposure of large-format printing plates 3, because a printing plate 3 can be exposed in a shorter time. FIG. 1 shows, as an example, an exposer having two exposure heads 11, which are disposed at a distance W in the axial direction and each focus a bundle of N laser beams 12 onto the printing plate 3. As a result, the printing plate 3 is simultaneously exposed with two groups of recording lines, which sweep over the drum surface at the axial distance W. After the exposure heads 11 have covered the feed distance W, the exposure of the printing plate 3 has been completed.

Figure 2A:
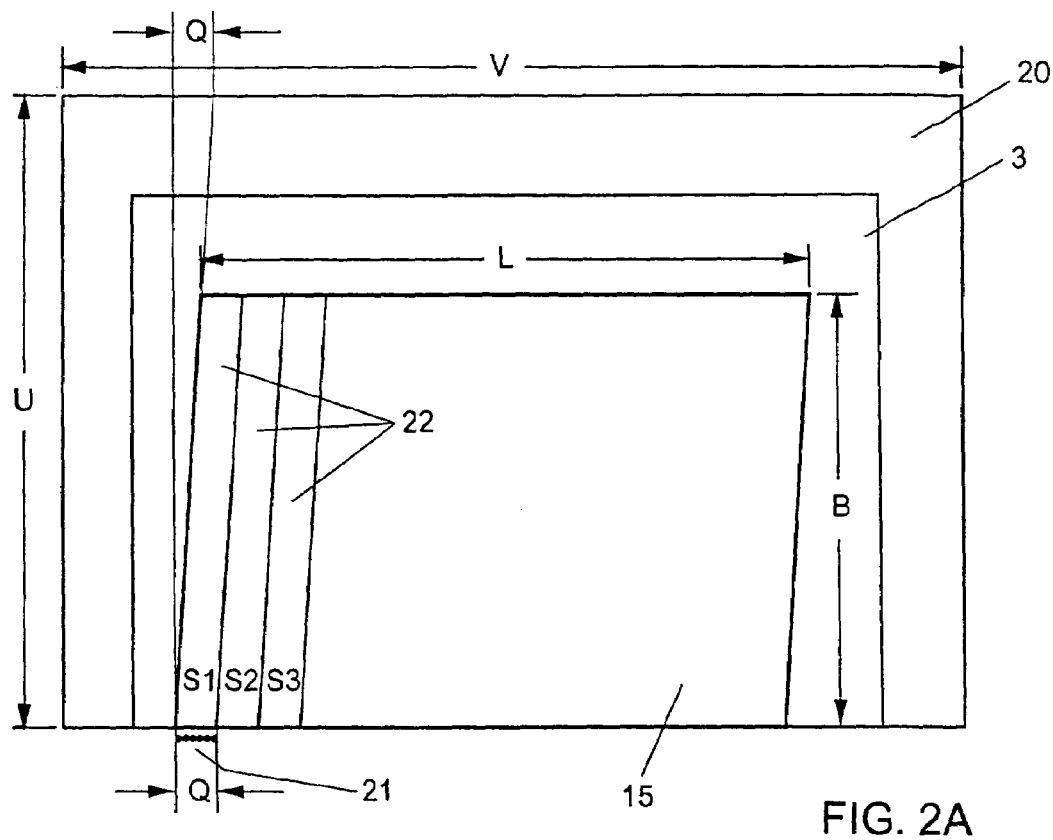
FIG. 2A is a diagrammatic illustration of a skewed recording of a printing original on an unwound drum surface according to the invention.

FIG. 2A illustrates the skewed recording that results during the exposure with N laser beams in each case. FIG. 2A shows the unwound drum surface 20 with the dimensions U in the circumferential direction and V in the feed direction. Clamped onto the drum surface 20 is the printing plate 3, on which the printing original 15 is recorded with the dimensions B in the circumferential direction and L in the feed direction. The recording is, in each case, carried out in parallel with N laser beams 12, which are imaged as a linear array of exposure points 21 oriented in the feed direction. The number of exposure points 21 in the array is, for example, N=64. If the exposure drum rotates, image strips 22 of N parallel recording lines are exposed in each case, being designated S1, S2, S3, and so on in FIG. 2A. With the resolution A, for example A=100 image points/mm, the strip width Q in mm is:

$$Q=N/A \quad (1)$$

The feed speed of the exposure head is set such that, after a drum revolution, it has moved in the feed direction by the distance Q, so that the image strips 22 exposed during each drum revolution follow one another in a seamless manner.

Figure 2B:
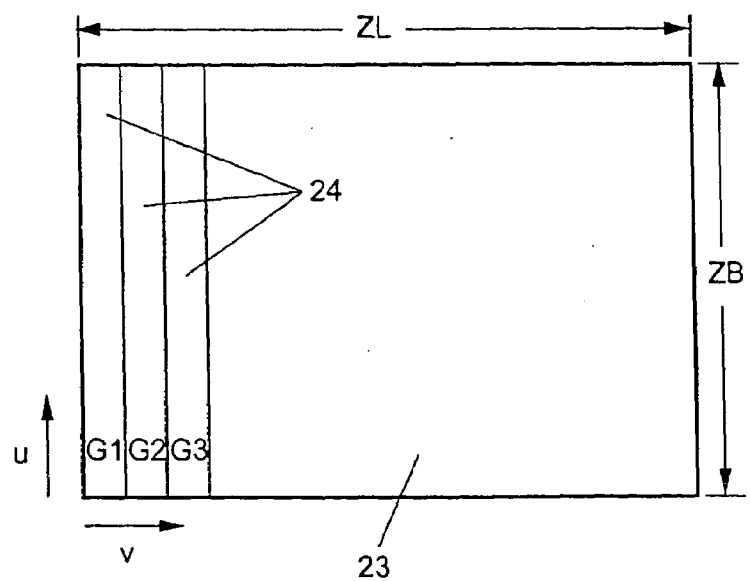
FIG. 2B is a diagrammatic illustration of a memory organization for an image point matrix according to the invention.

FIG. 2B shows a memory organization for the image point matrix 23 to be exposed. The memory is organized two-dimensionally, with the dimension direction u, which corresponds to the circumferential direction on the exposure drum, and the dimension direction v, which corresponds to the feed direction on the exposure drum. The image point matrix 23 has ZB image points in the circumferential direction u, that is to say, each image line includes ZB image points, and the image point matrix 23 has ZL image lines in the feed direction v. The number ZB of image points per image line and the number ZL of image lines are given by the dimensions of the printing original 15 and by the resolution as:

$$ZB = B \times A$$

$$ZL = L \times A \quad (2)$$

In the image point matrix 23, image line groups 24, which are designated G1, G2, G3, and so on in FIG. 2B, correspond to the image strips 22 of N parallel exposed image lines in each case. Each image line group 24 includes the image data from N recording lines, which are exposed as an image strip 22. Because the recording lines are recorded in a skewed manner corresponding to the helix around the exposure drum 1, the result of this is parallelogram distortion of the image point matrix 23 on the recorded printing original 15.

Figure 3:
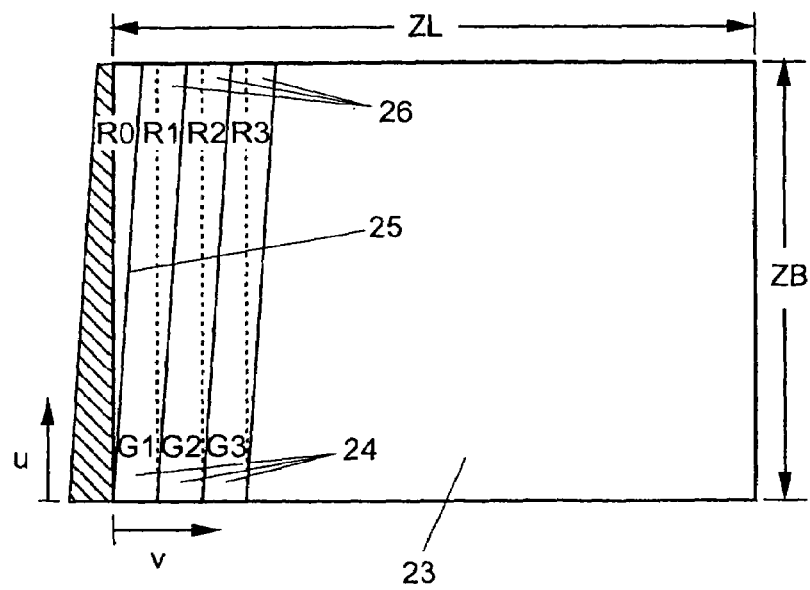
FIG. 3 is a diagrammatic illustration of a relationship between groups of image lines and recording lines according to the invention.

According to the method of the invention, the image data is read from the memory of the image point matrix 23 on read paths that are located in a skewed manner, their angle corresponding to the angle of the skewed recording on the exposure drum 1. This is illustrated in FIG. 3. Along a skewed read path, in each case a recording line 25 of image data is put together from the stored image point matrix 23, the data being taken section-by-section from various image lines of the image point matrix. In each case N parallel recording lines 25 form a recording line group 26. The recording line groups 26 are designated R0, R1, R2, R3, and so on in FIG. 3, the image line groups 24 are shown dashed. Each recording line group 26 is exposed as a corresponding image strip 22.

Figure 4:
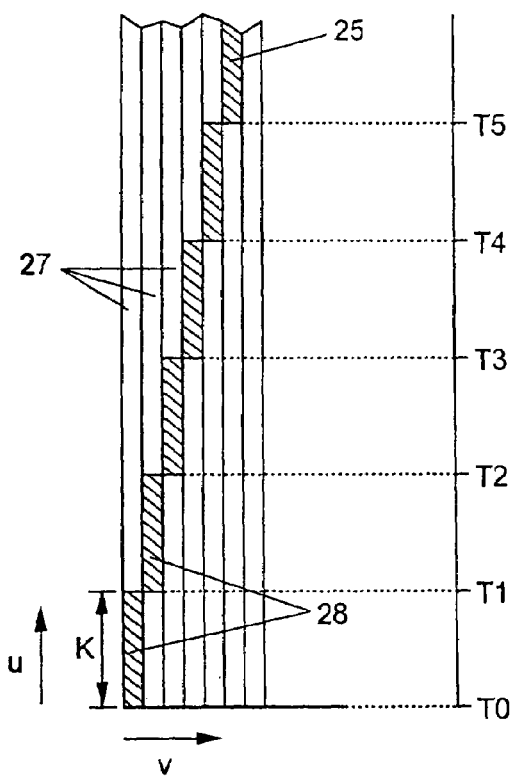
FIG. 4 is a fragmentary, diagrammatic illustration of a construction of a recording line as sections of image lines according to the invention.

FIG. 4 shows a detail from the image point matrix 23 with individual image lines 27 and the construction of a recording line 25 from line sections 28. The recording line 25 is assembled from line sections 28 that are in each case K image points long. Because, for the first K image points of the recording line 25, a first line section 28 is taken from the image points 0 ... K−1 of a first image line 27 of the image point matrix 23, for the next K image points of the recording line 25, a second line section 28 is taken from the image points K ... 2K−1 of the image line that is adjacent to the first image line in the feed direction v, and so on. The number of image points K for each line section 28 is determined such that N line sections 28 together give the number of image points that corresponds to the circumference U of the drum surface 20, that is to say, the following is true:

$$K = (U \times A)/N \quad (3)$$

In determining the circumference U, the thickness of the printing plate 3 is taken into account, that is to say, the circumference U is calculated from the radius of the exposure drum 1 plus the thickness of the printing plate 3. Because the value for K determined in accordance with equation (3) is generally not an integer, the image point at which the recording line 25 changes to the next image line 27 is determined by rounding to the next integer, that is to say, for the image point Ti at which the ith line section 28 begins, it is true that:

$$Ti = [i \times K]_1 \quad (i = 0, 1, 2, \ldots) \quad (4)$$

In equation (4), the index 1 of the square bracket signifies rounding to the next integer. Both the counting of the image points and the counting of the line sections begin at zero. In FIG. 4, the change points Ti are marked on a scale. The change to the next line section 28 for all the recording lines 25 of a recording line group 26 will, expediently, be made at the same change points Ti in each case.

The assembly of the recording lines 25 from the line sections 28 of the image lines 27 in the image point matrix 23 is, preferably, carried out by a computer program. For such a purpose, a sufficiently large number of image lines 27 of the image point matrix 23 is provided, for example, in a memory area. In a second memory area, the recording lines 25 for recording line group 26 are stored temporarily, by copying the corresponding line sections 28 from which the recording lines 25 are formed from the first memory area into the second memory area. For the assembly of the next recording line groups 26, the image lines 27 needed for this purpose in each case are reloaded from the image point matrix 23 into the first memory area, the entire image point matrix 23 being stored on a hard disk, for example. During copying, rotation of the recording data through 90 degrees can also be carried out, the image points being resorted such that in each case the image points that are needed simultaneously for driving the array of exposure points 21 for each exposure position in the circumferential direction of the exposure drum 1 are packed densely. So that no image data from the image point matrix 23 is lost during the recording, the first recording line group 26 (R0 in FIG. 3) is positioned in the feed direction such that it begins before the image point matrix 23. The part of the recording lines 25 that is hatched in FIG. 3 is, in this case, filled with zero data, that is to say, with image data that does not lead to any exposure of the recording material. The recording data so assembled is either supplied immediately to the exposure head 11 for the direct exposure of the recording material or it is stored temporarily on a hard disk to carry out the exposure at a later time.

Because the image point matrix, as explained previously, is a raster bit map, that is to say, each image point has a size of one bit, in the memory with a word length of 32 bits, for example, in each case 32 image points are expediently contained in one memory word. In particular, in the implementation of the method by a computer program, it would, therefore, be cumbersome and complicated to perform the change to the next line section 28 at an image point Ti that is located in the middle of a memory word. In a preferred embodiment of the method of the invention, provision is, therefore, made to carry out a change from one line section 28 to the next only at a memory word boundary. In such a case, the image point Ti at which the ith line section 28 begins is determined as:

$$Ti = [i \times K]_{32} \quad (i = 0, 1, 2 \ldots) \quad (5)$$

In equation (5), the index 32 of the square bracket signifies rounding to the next integer number that can be divided by 32.

Figure 5:
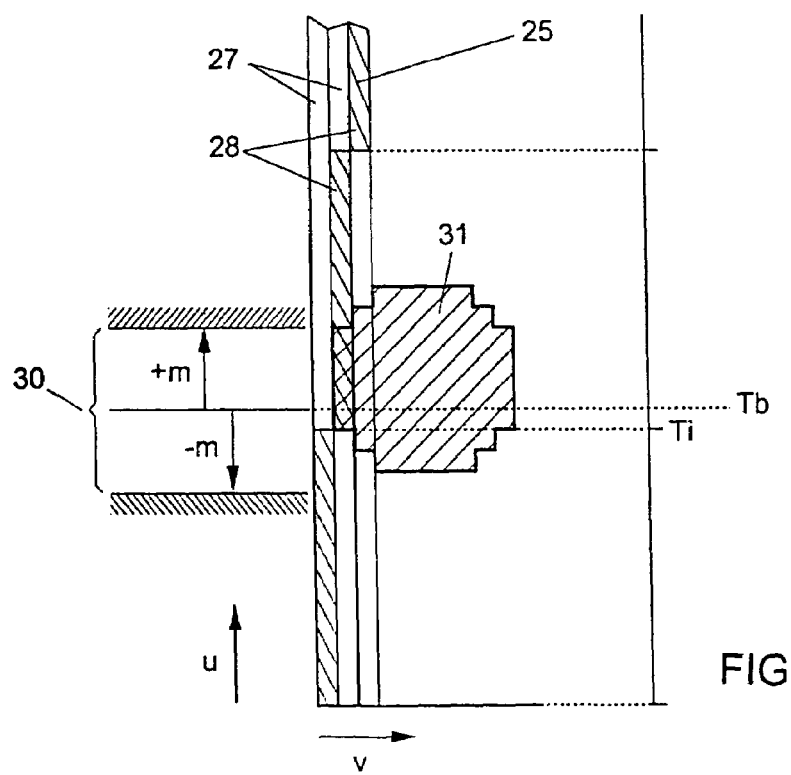
FIG. 5 is a fragmentary, diagrammatic illustration of a further embodiment of the construction of the recording line of FIG. 4.

FIG. 5 shows a further embodiment of the method according to the invention, in which the current change point Ti for the transition from one line section 28 to the next is determined on the basis of the image content. For such a purpose, around the change point Tb calculated in accordance with equation (4), a testing region 30 is formed that, in the circumferential direction u, reaches from −m image points before the calculated change point Tb as far as +m image points after the calculated change point Tb. The number m is defined based upon an empirical value, which can be determined by exposure trials and which ensures a good image quality of the recorded printing original 15. A suitable value is, for example, m=8, at which the testing area is approximately as large as the raster width, that is to say, as a side length of the raster cell on which the screening of the printing original 15 is based. A check is, then, made to see whether or not, within the testing region 30, on the current image line 27 or on the following image line to which a change is to be made, a color jump from white to black or from black to white occurs in the image data. If there is no color jump within the testing region 30, the change to the next line section 28 is carried out at the calculated change point Tb. If there is exactly one color jump within the testing region 30, either in the current image line 27 or in the following image line, the current change point Ti is displaced to the point of the color jump. In FIG. 5, a raster point 31 is shown that has the effect of a color jump in the image line 27 from which the next line section 28 is to be taken. If there is more than one color jump within the testing region 30, in the current image line 27, and/or in the following image line, the current change point Ti is displaced, for example, to the color jump that lies closest in the circumferential direction u to the calculated change point Tb. In such a case, the displacement of the current change point Ti can also be carried out in accordance with a different rule, for example, in accordance with a random selection to one of the color jumps within the testing region 30.

The change from one line section 28 to the next, controlled by the image content, can be made such that the examination of the testing region 30 and the decision as to where the current change point Ti will be placed are carried out separately for each recording line 25. In a simplified form, the testing and decision can, however, also be carried out for a recording line 25 from a number of p adjacent recording lines, and the decision about the position of the change point Ti can, then, be performed in the following p−1 recording lines. In a special case p=N, that is to say, the testing and decision are carried out only for one recording line 25 from a recording line group 26.

Although the method according to the invention has been described for the case in which the recording lines 25 are exposed directly beside one another, that is to say, with a distance between the recording lines that corresponds to the resolution A, the method can, however, also be applied to what is referred to as the interleave writing method. In the interleave writing method, the recording lines 25 have a greater spacing than that which corresponds to the resolution A. Given specific combinations of the number of lines N and the line spacing, in successive drum revolutions, the gaps between the recording lines 25 exposed initially are gradually filled with further recording lines so that, ultimately, gap-free exposure of the recording material is, nevertheless, carried out.

This application claims the priority, under 35 U.S.C. § 119, of German patent application No. 103 51 453.8, filed Nov. 4, 2003; the entire disclosure of the prior application is herewith incorporated by reference.

We claim:

1. A method for correcting a skewed recording of a printing original on a recording material in an exposer, which comprises:
    clamping the recording material onto an exposure drum;
    generating, with an exposure head, N laser beams projected onto the recording material as a linear array of exposure points oriented in a feed direction;
    continuously moving the exposure head along the exposure drum in an axial feed direction as the exposure drum rotates and recording the printing original along a helix wound around the exposure drum;
    modulating the laser beams with image data taken from a stored image point matrix organized in image lines;
    recording the printing original with an exposure resolution of A image points per unit length;
    forming recording lines from image data taken from the image point matrix along an angled read path;
    assembling the recording lines from line sections taken from adjacent image lines;
    determining a number of image points K per line section in accordance with the equation:

$$K=(U \times A)/N,$$

where U is the circumference of the exposure drum; and
    modulating the laser beams with the image data of the recording lines.

2. The method according to claim 1, which further comprises carrying out the recording lines forming step by forming recording lines from image data taken from the image point matrix along a read path running through the image point matrix at an angle formed by the helix with respect to a circumferential line of the exposure drum.

3. The method according to claim 1, which further comprises determining a change point Ti, at which a next line section in a next image line begins in accordance with the equation:

$$Ti = [i \times K]_1 \ (i=0, 1, 2, \ldots),$$

where the product in brackets is rounded to the next integer.

4. The method according to claim 1, which further comprises determining a change point Ti, at which a next line section in a next image line begins in accordance with the equation:

$$Ti = [i \times K]_{WL} \ (i=0, 1, 2, \ldots),$$

where:
the product in brackets is rounded to the next integer that can be divided by WL; and
WL is a word length in bits of a memory in which the image point matrix is stored.

5. The method according to claim 1, which further comprises:
    determining a calculated change point Tb for a start of an ith line section in a next image line in accordance with the equation:

$$Tb = [i \times K]_1 \ (i=0, 1, 2, \ldots),$$

where the product in brackets is rounded to the next integer;
    checking, in a testing region around the calculated change point Tb, if at least one color jump occurs in image data in at least one of a current image line and the next image line; and
    fixing a current change point Ti at which a next line section in the next image line begins at a point at which a color jump occurs in the image data.

6. The method according to claim 5, which further comprises fixing the current change point Ti at the color jump lying closest to the calculated change point Tb.

7. The method according to claim 1, which further comprises exposing N recording lines with a spacing 1/A in parallel on the recording material.

8. A method for correcting a skewed recording of a printing original on a recording material in an exposer, which comprises:
    clamping the recording material onto an exposure drum;

generating, with an exposure head, N laser beams projected onto the recording material as a linear array of exposure points oriented in a feed direction;

continuously moving the exposure head along the exposure drum in an axial feed direction as the exposure drum rotates and recording the printing original along a helix wound around the exposure drum;

modulating the laser beams with image data taken from a stored image point matrix organized in image lines;

recording the printing original with an exposure resolution of A image points per unit length;

forming recording lines from image data taken from the image point matrix along an angled read path;

modulating the laser beams with the image data of the recording lines; and exposing N recording lines with a spacing that is a multiple of 1/A in parallel on the recording material.

9. The method according to claim 8, which further comprises carrying out the recording lines forming step by forming recording lines from image data taken from the image point matrix along a read path running through the image point matrix at an angle formed by the helix with respect to a circumferential line of the exposure drum.

* * * * *